United States Patent
Huber et al.

(10) Patent No.: US 7,852,012 B2
(45) Date of Patent: Dec. 14, 2010

(54) CIRCUIT APPARATUS WITH A HIGH-SIDE BUCK TRANSISTOR

(75) Inventors: Andreas Huber, Maisach (DE); Peter Niedermeier, München (DE)

(73) Assignee: OSRAM Gesellschaft mit beschraenkter Haftung, Munich (DE)

( * ) Notice: Subject to any disclaimer, the term of this patent is extended or adjusted under 35 U.S.C. 154(b) by 422 days.

(21) Appl. No.: 12/085,374

(22) PCT Filed: Nov. 22, 2006

(86) PCT No.: PCT/EP2006/068733

§ 371 (c)(1),
(2), (4) Date: May 22, 2008

(87) PCT Pub. No.: WO2007/060168

PCT Pub. Date: May 31, 2007

(65) Prior Publication Data

US 2009/0273291 A1    Nov. 5, 2009

(30) Foreign Application Priority Data

Nov. 25, 2005  (DE) .................. 10 2005 056 255

(51) Int. Cl.
H05B 41/36   (2006.01)
H05B 37/00   (2006.01)
(52) U.S. Cl. .................. 315/209 R; 315/185 R
(58) Field of Classification Search ............. 315/209 R, 315/224, 244, 307, 312, 185 R
See application file for complete search history.

(56) References Cited

U.S. PATENT DOCUMENTS

| 4,423,341 | A | 12/1983 | Shelly |
| 5,126,651 | A | 6/1992 | Gauen |
| 5,404,095 | A | 4/1995 | Lammers |
| 6,094,087 | A | 7/2000 | He et al. |
| 6,351,079 | B1 * | 2/2002 | Willis ............ 315/200 A |
| 6,515,434 | B1 * | 2/2003 | Biebl ............... 315/291 |
| 6,621,235 | B2 * | 9/2003 | Chang ............ 315/216 |
| 7,317,287 | B2 * | 1/2008 | Blumel ............ 315/291 |
| 2003/0062930 | A1 | 4/2003 | Li et al. |
| 2004/0041620 | A1 | 3/2004 | D'Angelo et al. |
| 2004/0070375 | A1 | 4/2004 | Formanek |

FOREIGN PATENT DOCUMENTS

WO    03/073596 A1    9/2003

* cited by examiner

Primary Examiner—Douglas W Owens
Assistant Examiner—Minh D A

(57) ABSTRACT

A cost-effective driver circuit for an LED background lighting unit includes a buck circuit with an upper transistor is driven via two further transistors. The first transistor is connected with its reference electrode to the positive terminal of a DC voltage source, with its working electrode to the control electrode of the buck transistor and with its control electrode, via a capacitor, to a signal contact, which can be driven externally. The second transistor is connected with its reference electrode to ground, with its working electrode to the control electrode of the buck transistor and with its control electrode to a signal contact, which can be driven externally. The buck transistor can be switched on via a corresponding gate signal at the terminal for the purpose of operating the light-emitting diodes. Advantageously, cost-effective standard transistors for operating voltages below 100 V can be used for the switching controller.

13 Claims, 1 Drawing Sheet

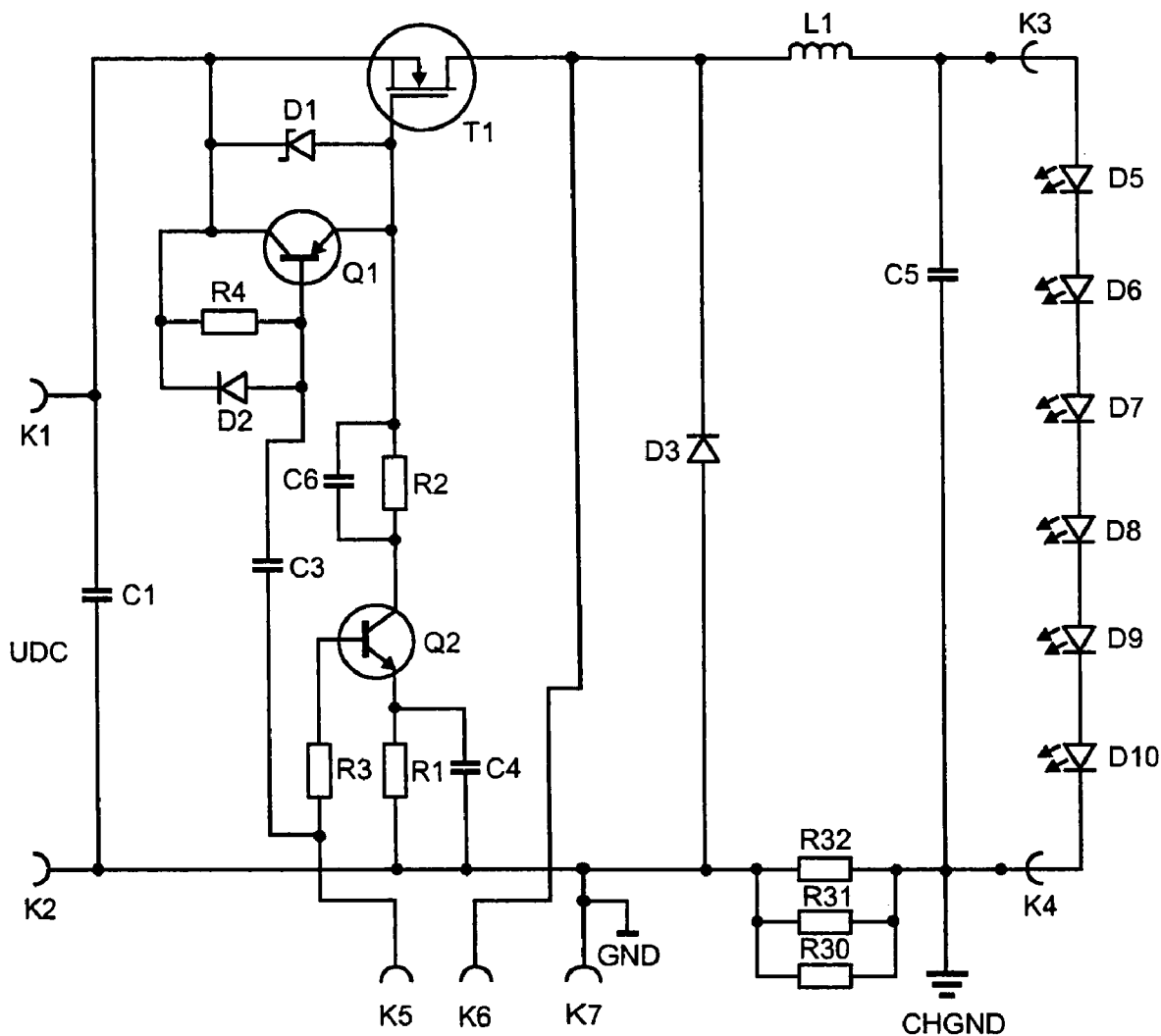

CIRCUIT APPARATUS WITH A HIGH-SIDE BUCK TRANSISTOR

TECHNICAL FIELD

The present invention relates to a circuit apparatus for operating a luminous device with a switching element, whose reference electrode can be connected to the positive pole of a DC voltage source and whose working electrode can be connected to a first contact of the luminous device and which has a control electrode. In addition, the circuit apparatus has a contact device, with which a second contact of the luminous device can be connected to the negative pole of the DC voltage source.

PRIOR ART

A so-called backlight unit (BLU) is used for backlighting an LCD monitor. This backlight unit is conventionally implemented using LEDs. A so-called buck circuit is often used to drive an LED BLU. This circuit acts as a step-down converter, the high supply voltage being reduced to the lower level of a drive voltage for the LED BLU for current limitation purposes.

In order to use a buck circuit in an LED BLU, it is advantageous in the event of current measurement if the switching transistor is at the top (i.e. at the positive potential) and the current measurement can take place at the negative potential. This results in the problem of it being necessary to drive the switching transistor with a higher voltage than the supply voltage. Complete IC solutions for system voltage applications are on the market for the purpose of driving a high-side transistor. Typical high-side drivers are suitable for supply voltages of 600 V. Such drivers are less capable of being used for supply voltages of from 12 to 100 V, however. For this voltage range, a specially produced driver would therefore be necessary. However, this would be comparatively expensive.

DESCRIPTION OF THE INVENTION

The object of the present invention therefore consists in finding a cost-effective solution for operating a luminous device with a buck circuit which has a high-side switching element.

This object is achieved according to the invention by a circuit apparatus for operating a luminous device with a switching element, whose reference electrode can be connected to the positive pole of a DC voltage source and whose working electrode can be connected to a first contact of the luminous device and which has a control electrode, and a contact device, with which a second contact of the luminous device can be connected to the negative pole of the DC voltage source, a first transistor (Q1) being connected with its reference electrode to the positive pole of the DC voltage source, with its working electrode to the control electrode of the switching element and with its control electrode, via a capacitor (C3), to an externally drivable signal contact, and a second transistor (Q2) being connected with its reference electrode to the contact device, with its working electrode to the control electrode of the switching element and with its control electrode to the externally drivable signal contact.

With the circuit apparatus according to the invention an expensive high-side driver manufactured as an individual component for a low voltage range can be avoided. In addition to the high-side switching element, only two cost-effective standard transistors are required.

Preferably, the switching element comprises a p-channel power MOSFET transistor of the enhancement type. Thus, the luminous device driven by the circuit apparatus is in principle switched off if this transistor is not deliberately switched on.

The first and second transistor of the circuit device may comprise a field effect transistor. In particular, MOSFETs are suitable for driving the switching element. Alternatively, the two transistors can also be bipolar transistors. In particular it is favorable if the first transistor is a pnp bipolar transistor and the second transistor is an npn bipolar transistor.

Preferably, a first RC element is connected between the output electrode of the second transistor and the control electrode of the switching element, and a second RC element is connected between the reference electrode of the second transistor and the contact device. These RC elements can be used to set the switching speed of the switching element.

In addition, one or more shunt resistors can be connected between the contact device and the second contact of the luminous device. The output current can thus be measured. In order to achieve the desired resistance value, a corresponding resistive circuit with resistors having a suitable power loss can be used.

BRIEF DESCRIPTION OF THE DRAWING(S)

The present invention will now be explained in more detail with reference to the attached drawing, which shows a circuit diagram of a circuit apparatus according to the invention for an LED BLU.

PREFERRED EMBODIMENT OF THE INVENTION

The exemplary embodiment described in more detail below represents a preferred embodiment of the present invention.

The circuit illustrated in the FIGURE is supplied by a DC voltage source (not illustrated), which produces a DC voltage UDC for the terminals K1 and K2. This DC voltage is in this case less than 100 V. Moreover, a capacitor C1, which conventionally contributes to smoothing of the DC voltage UDC, is connected between the terminals K1 and K2. The terminal K2 represents the ground potential.

A p power MOS transistor T1 is connected to the positive pole of the DC voltage source, i.e. to the terminal K1. A high-side buck transistor results. The output electrode of the buck transistor T1 is connected to a terminal K3 via an inductor L1. The terminal K2 is connected to the terminal K4 via shunt resistors R30, R31 and R32 which are connected in parallel with one another. An LED array, in this case illustrated in simplified form by a series circuit comprising six light-emitting diodes D5 to D10, is clamped between the terminals K3 and K4. In addition, a capacitor C5 for smoothing the supply voltage of the light-emitting diodes is located between the terminals K3 and K4. A freewheeling diode D3 is connected with its cathode to the output electrode of the buck transistor T1 and with its anode to the terminal K2. The buck transistor T1 and the freewheeling diode D3 and L1 perform the step-down converter function.

The control electrode of the buck transistor T1 is driven by two bipolar transistors Q1 and Q2, which can alternatively be in the form of MOSFET transistors. The transistor Q1 is implemented as a pnp transistor and the transistor Q2 as an npn transistor. The emitter or the reference electrode of the transistor Q1 is connected to the terminal K1, while the emitter or the output electrode of the transistor Q1 is connected to the control electrode of the buck transistor T1. A zener diode D1 for protecting the transistor Q1 is located between the source and gate of the transistor T1. A parallel circuit comprising a diode D2 and a resistor R4 is connected between the base, i.e. the control electrode, and the collector of the transistor Q1.

The collector, i.e. the output electrode, of the transistor Q2 is connected to the control electrode of the buck transistor T1 via a parallel circuit comprising a resistor R2 and a capacitor C6. The emitter, i.e. the reference electrode of the transistor Q2, is connected to the terminal K2 via a further parallel circuit comprising a resistor R1 and a capacitor C4. The base, i.e. the control electrode, of the transistor Q2 is connected to a signal terminal K5 via a resistor R3. Likewise, the base of the transistor Q1 is connected to the terminal K5 via a capacitor C3. A switching signal can be fed into the terminal K5 in order to drive the buck transistor T1 in a suitable manner. The gate signal used for this purpose comprises, for example, a sequence of square-wave pulses.

Further terminals K6 and K7 are connected to the output electrode of the buck transistor T1 or to ground. Certain taps can therefore be realized, for example.

The high-side buck transistor T1 is a p-channel transistor of the enhancement type. It is therefore normally switched off. If the transistor Q2 is turned on via R3, the gate of the buck transistor T1 is negative in relation to its source (reference electrode) and the buck transistor T1 switches on. When the gate signal is incident at the buck transistor T1, the transistor Q1 is turned on for a short period of time by the capacitor C3. It is conducting and switches the buck transistor T1 off again.

The shunt resistors R30, R31 and R32 are used to measure the output current. In principle, one resistor is sufficient for this if the resistance value and the power loss have a suitable magnitude. However, it is usually necessary for reasons of cost to achieve a specific resistance value by means of a plurality of resistors.

In accordance with the invention it is therefore possible to operate an LED BLU by means of two cost-effective standard transistors Q1, Q2 with one p power MOS transistor T1. Sufficiently favorable p-channel power MOSFETs are available on the market for the voltage range of up to 60 V.

The invention claimed is:

1. A circuit apparatus for operating a luminous device with
   a switching element (T1), whose reference electrode is connected to the positive pole (K1) of a DC voltage source and whose working electrode is connected to a first contact (K3) of the luminous device (D5 to D10) and which has a control electrode, and
   a contact device, with which a second contact (K4) of the luminous device (D5 to D10) is connected to the negative pole (K2) of the DC voltage source,
   characterized in that
   a first transistor (Q1) is connected with its reference electrode to the positive pole (K1) of the DC voltage source, with its working electrode to the control electrode of the switching element (T1) and with its control electrode, via a capacitor (C3), to an externally drivable signal contact (K5), and
   a second transistor (Q2) is connected with its reference electrode to the contact device, with its working electrode to the control electrode of the switching element (T1) and with its control electrode to the externally drivable signal contact (K5).

2. The circuit apparatus as claimed in claim 1, the switching element (T1) comprising a p-channel power MOSFET transistor of the enhancement type.

3. The circuit apparatus as claimed in claim 2, the first and second transistor (Q1, Q2) in each case being a field effect transistor.

4. The circuit apparatus as claimed in claim 2, the first transistor (Q1) being a pnp bipolar transistor.

5. The circuit apparatus as claimed in claim 2, the second transistor (Q2) being an npn bipolar transistor.

6. The circuit apparatus as claimed in claim 2, a first RC element (R2, C6) being connected between the output electrode of the second transistor (Q2) and the control electrode of the switching element (T1), and a second RC element (R1, C4) being connected between the reference electrode of the second transistor (Q2) and the contact device.

7. The circuit apparatus as claimed in claim 2, one or more shunt resistors (R30, R31, R32) being connected between the contact device and the second contact of the luminous device (K4).

8. The circuit apparatus as claimed in claim 1, the first and second transistor (Q1, Q2) in each case being a field effect transistor.

9. The circuit apparatus as claimed in claim 1, the first transistor (Q1) being a pnp bipolar transistor.

10. The circuit apparatus as claimed in claim 9, the second transistor (Q2) being an npn bipolar transistor.

11. The circuit apparatus as claimed in claim 1, the second transistor (Q2) being an npn bipolar transistor.

12. The circuit apparatus as claimed in claim 1, a first RC element (R2, C6) being connected between the output electrode of the second transistor (Q2) and the control electrode of the switching element (T1), and a second RC element (R1, C4) being connected between the reference electrode of the second transistor (Q2) and the contact device.

13. The circuit apparatus as claimed in claim 1, one or more shunt resistors (R30, R31, R32) being connected between the contact device and the second contact of the luminous device (K4).

* * * * *